United States Patent
Byers et al.

(10) Patent No.: US 10,192,023 B2
(45) Date of Patent: Jan. 29, 2019

(54) MODEL COMPARISON TOOL

(71) Applicant: General Electric Company, Schenectady, NY (US)

(72) Inventors: Jason Anton Byers, Greenville, SC (US); Miller Glenn Byrd, Greer, SC (US); Brian Christopher Wheeler, Simpsonville, SC (US)

(73) Assignee: General Electric Company, Schenectady, NY (US)

( * ) Notice: Subject to any disclaimer, the term of this patent is extended or adjusted under 35 U.S.C. 154(b) by 0 days.

(21) Appl. No.: 15/590,707

(22) Filed: May 9, 2017

(65) Prior Publication Data
US 2018/0330042 A1    Nov. 15, 2018

(51) Int. Cl.
| | | |
|---|---|---|
| G06T 7/00 | (2017.01) | |
| G06T 7/33 | (2017.01) | |
| G06T 17/50 | (2006.01) | |
| G06T 17/10 | (2006.01) | |
| G06T 19/00 | (2011.01) | |
| G06F 17/50 | (2006.01) | |

(52) U.S. Cl.
CPC ........ *G06F 17/5095* (2013.01); *G06T 7/0004* (2013.01); *G06T 7/344* (2017.01); *G06T 17/10* (2013.01); *G06T 19/006* (2013.01)

(58) Field of Classification Search
None
See application file for complete search history.

(56) References Cited

U.S. PATENT DOCUMENTS

| | | | |
|---|---|---|---|
| 7,062,532 B1 | 6/2006 | Sweat et al. | |
| 2005/0108215 A1 | 5/2005 | Thomas et al. | |
| 2006/0136774 A1* | 6/2006 | Nagafuchi | G06Q 10/06 714/4.4 |
| 2008/0062195 A1* | 3/2008 | Brown | G06F 17/50 345/619 |
| 2011/0245937 A1* | 10/2011 | Rawson | G09B 25/02 700/90 |
| 2014/0249779 A1* | 9/2014 | Cheung | G06F 17/50 703/1 |
| 2016/0147907 A1* | 5/2016 | Ni | G06F 17/50 703/1 |

OTHER PUBLICATIONS

Outstanding tools in ANSA and META—Model Comparison—BETA simulation solutions—Aug. 1, 2013.*

(Continued)

*Primary Examiner* — Mark K Zimmerman
*Assistant Examiner* — YuJang Tswei
(74) *Attorney, Agent, or Firm* — Fletcher Yoder, P.C.

(57) ABSTRACT

A system includes a display and a processor. The processor is configured to receive a first computer-aided design (CAD) model representing at least one part of a machine, receive a second CAD model representing the at least one part of the machine, and identify one or more differences between the first CAD model and the second CAD model. The processor is also configured to populate a discrepancy list including the one or more differences between the first CAD model and the second CAD model, receive an input to review the discrepancy list, and display a visualization having the discrepancy list via the display upon receipt of the input.

19 Claims, 6 Drawing Sheets

(56) References Cited

OTHER PUBLICATIONS

Suzuki, "CADValidator_A Critical Aid for the Model-Based Enterprise", Dec. 2016, Elysium (Year: 2016).*
Lombard, Matt; "Overview of CAD Geometry Comparison Tools"; CADDigest; http://www.caddigest.com/overview-of-cad-geometry-comparison-tools/; Apr. 3, 2012.
Dong, Gu Yong; "\nx6\md01\043_NX7 7 model compare"; YouTube; https://www.youtube.com/watch?v=zhKKBkNUzBk; Nov. 22, 2012; video last accessed May 9, 2017.

* cited by examiner

MODEL COMPARISON TOOL

BACKGROUND

The subject matter disclosed herein relates to systems and methods for design and design revision of parts, such as industrial machine parts.

Certain design and design revision techniques may be used to create a variety of machinery, including industrial machines. Industrial machines, such as gas turbine systems, may provide for the generation of power. For example, the gas turbine systems typically include a compressor for compressing a working fluid, such as air, a combustor for combusting the compressed working fluid with fuel, and a turbine for turning the combusted fluid into a rotative power. The compressed air is injected into a combustor, which heats the fluid causing it to expand, and the expanded fluid is forced through the gas turbine. The gas turbine may then convert the expanded fluid into rotative power, for example, by a series of blade stages. The rotative power may then be used to drive a load, which may include an electrical generator producing electrical power and electrically coupled to a power distribution grid. Industrial machines and machine parts may be designed for a particular purpose, such as a compressor blade designed to compress air. The machine or part may have gone through one or more revisions before being implemented. It may be beneficial to improve the design revision techniques of machine and machine parts.

BRIEF DESCRIPTION

Certain embodiments commensurate in scope with the original claims are summarized below. These embodiments are not intended to limit the scope of the claims, but rather these embodiments are intended only to provide a brief summary of possible forms of the embodiments described herein. Indeed, the present disclosure may encompass a variety of forms that may be similar to or different from the embodiments set forth below.

In a first embodiment, a system includes a display and a processor. The processor is configured to receive a first computer-aided design (CAD) model representing at least one part of a machine, receive a second CAD model representing the at least one part of the machine, and identify one or more differences between the first CAD model and the second CAD model. The processor is also configured to populate a discrepancy list including the one or more differences between the first CAD model and the second CAD model, receive an input to review the discrepancy list, and display a visualization having the discrepancy list via the display upon receipt of the input.

In a second embodiment, a method includes receiving, via a processor, a first computer-aided design (CAD) model representing at least one part of a machine, receiving, via the processor, a second CAD model representing the at least one part of the machine, and identifying, via the processor, one or more differences between the first CAD model and the second CAD model. The method also includes populating, via the processor, a discrepancy list including the one or more differences between the first CAD model and the second CAD model, receiving, via the processor, an input to review the discrepancy list, and displaying, via the processor, a visualization having the discrepancy list via a display upon receipt of the input In a third embodiment, a non-transitory computer-readable medium including computer-executable instructions is configured to cause a processor to receive a first computer-aided design (CAD) model representing at least one part of a machine, receive a second CAD model representing the at least one part of the machine, and identify one or more differences between the first CAD model and the second CAD model. The computer-executable instructions is also configured to cause the processor to populate a discrepancy list including the one or more differences between the first CAD model and the second CAD model, receive an input to review the discrepancy list, and display a visualization including the discrepancy list via a display upon receipt of the input.

BRIEF DESCRIPTION OF THE DRAWINGS

These and other features, aspects, and advantages of the presently disclosed embodiments will become better understood when the following detailed description is read with reference to the accompanying drawings in which like characters represent like parts throughout the drawings, wherein.

DETAILED DESCRIPTION

One or more specific embodiments of the present disclosure will be described below. In an effort to provide a concise description of these embodiments, all features of an actual implementation may not be described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

When introducing elements of various embodiments of the present invention, the articles "a," "an," "the," and "said" are intended to mean that there are one or more of the elements. The terms "comprising," "including," and "having" are intended to be inclusive and mean that there may be additional elements other than the listed elements.

Designing a machine or part may include certain systems and methods described in more detail below that produce a design for a part or product. For example, the design may be created as a model-based definition included in a 3-dimensional (3D) computer-aided design (CAD) model and associated product manufacturing information (PMI). The techniques described herein may not create typical engineering part drawing or drawings, as the CAD model and PMI may contain all part dimensional and tolerance information, as further described below.

After creating an initial design, the design may go through one or more revisions before a design stage of the machine or part is complete. When a revision is made to an element of the design, other elements may inadvertently experience a change as well. Further, a user may want to quickly review changes between versions of a design. Accordingly, a comparison tool may be implemented to flag changes between different revisions of the machine or part. The comparison tool may compare an older version of the machine or part to an updated version of the machine or part. The comparison tool may then display discrepancies between the older version and the updated version in one or more formats. However, not all discrepancies may be pertinent to the updated design. An operator may choose to disregard and/or verify some of the discrepancies. In some embodiments, documentation of the discrepancies may be utilized may a downstream manufacturer. By quickly determining what is different between designs, a user may efficiently be able to check that desired changes were incorporated, and check that undesired modifications were not incorporated.

Figure 1:
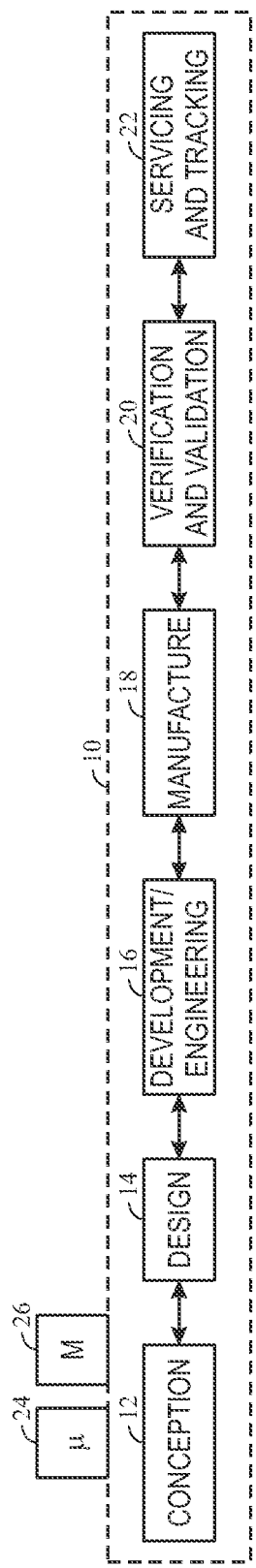
FIG. 1 is a block diagram of an embodiment of a computer-aided technology (CAx) system, in accordance with the embodiments described herein.

With the foregoing in mind, it may be useful to describe a computer-aided technologies (CAx) system that may incorporate the techniques described herein, for example suitable for executing one or more product lifecycle management (PLM) processes. Accordingly, FIG. 1 illustrates an embodiment of a CAx system 10 suitable for providing for a variety of processes, including PLM processes 12, 14, 16, 18, 20, 22. In the depicted embodiment, the CAx system 10 may include support for execution of conception processes 12. For example, the conception processes 12 may produce a set of specifications such as requirements specifications documenting a set of requirements to be satisfied by a design, a part, a product, or a combination thereof. The conception processes 12 may also produce a concept or prototype for the part or product (e.g., machine). A series of design processes 14 may then use the specifications and/or prototype to produce, for example, one or more 3-dimensional (3D) design models of the part or product. The 3D design models may include solid/surface modeling, parametric models, wireframe models, vector models, non-uniform rational basis spline (NURBS) models, geometric models, and the like, describing part geometries and structures. The PMI may include geometric dimensions, tolerances, text (e.g., annotations, notes), other dimensions, material type, material specifications, finishes (e.g., surface finishes), clearances, and so on, associated with the 3D models. Models designed utilizing design processes 14 may go through several revision iterations. Therefore, as discussed in detail below, a model comparing tool may be utilized to flag and document changes made in revision iterations.

Design models may then be further refined and added to via the execution of development/engineering processes 16. The development/engineering processes may, for example, create and apply models such as thermodynamic models, low cycle fatigue (LCF) life prediction models, multibody dynamics) and kinematics models, computational fluid dynamics (CFD) models, finite element analysis (FEA) models, and/or 3-dimension to 2-dimension FEA mapping models that may be used to predict the behavior of the part or product during its operation. For example, turbine blades may be modeled to predict fluid flows, pressures, clearances, and the like, during operations of a gas turbine engine. The development/engineering processes 16 may additionally result in tolerances, materials specifications (e.g., material type, material hardness), clearance specifications, and the like.

The CAx system 10 may additionally provide for manufacturing processes 18 that may include manufacturing automation support. For example, additive manufacturing models may be derived, such as 3D printing models for material jetting, binder jetting, vat photopolymerization, powder bed fusion, sheet lamination, directed energy deposition, material extrusion, and the like, to create the part or product. Other manufacturing models may be derived, such as computer numeric control (CNC) models with G-code to machine or otherwise remove material to produce the part or product (e.g., via milling, lathing, plasma cutting, wire cutting, and so on). Bill of materials (BOM) creation, requisition orders, purchasing orders, and the like, may also be provided as part of the manufacture processes 18 (or other PLM processes).

The CAx system 10 may additionally provide for verification and/or validation processes 20 that may include automated inspection of the part or product as well as automated comparison of specifications, requirements, and the like. In one example, a coordinate-measuring machine (CMM) process may be used to automate inspection of the part or product.

A servicing and tracking set of processes 22 may also be provided via the CAx system 10. The servicing and tracking processes 22 may log maintenance activities for the part, part replacements, part life (e.g., in fired hours), and so on. As illustrated, the CAx system 10 may include feedback between the processes 12, 14, 16, 18, 20, 22. For example, data from services and tracking processes 22, for example, may be used to redesign the part or product via the design processes 14. Indeed, data from any one of the processes 12, 14, 16, 18, 20, 22 may be used by any other of the processes 12, 14, 16, 18, 20, 22 to improve the part or product or to create a new part or a new product. In this manner, the CAx system 10 may incorporate data from downstream processes and use the data to improve the part or to create a new part.

The CAx system 10 may additionally include one or more processors 24 and a memory system 26 that may execute software programs to perform the disclosed techniques. Moreover, the processors 24 may include multiple microprocessors, one or more "general-purpose" microprocessors, one or more special-purpose microprocessors, and/or one or more application specific integrated circuits (ASICS), or some combination thereof. For example, the processors 24 may include one or more reduced instruction set (RISC) processors. The memory system 26 may store information such as control software, look up tables, configuration data, etc. The memory system 26 may include a tangible, non-transitory, machine-readable medium, such as a volatile memory (e.g., a random access memory (RAM)) and/or a nonvolatile memory (e.g., a read-only memory (ROM), flash memory, a hard drive, or any other suitable optical, magnetic, or solid-state storage medium, or a combination thereof).

Figure 2:
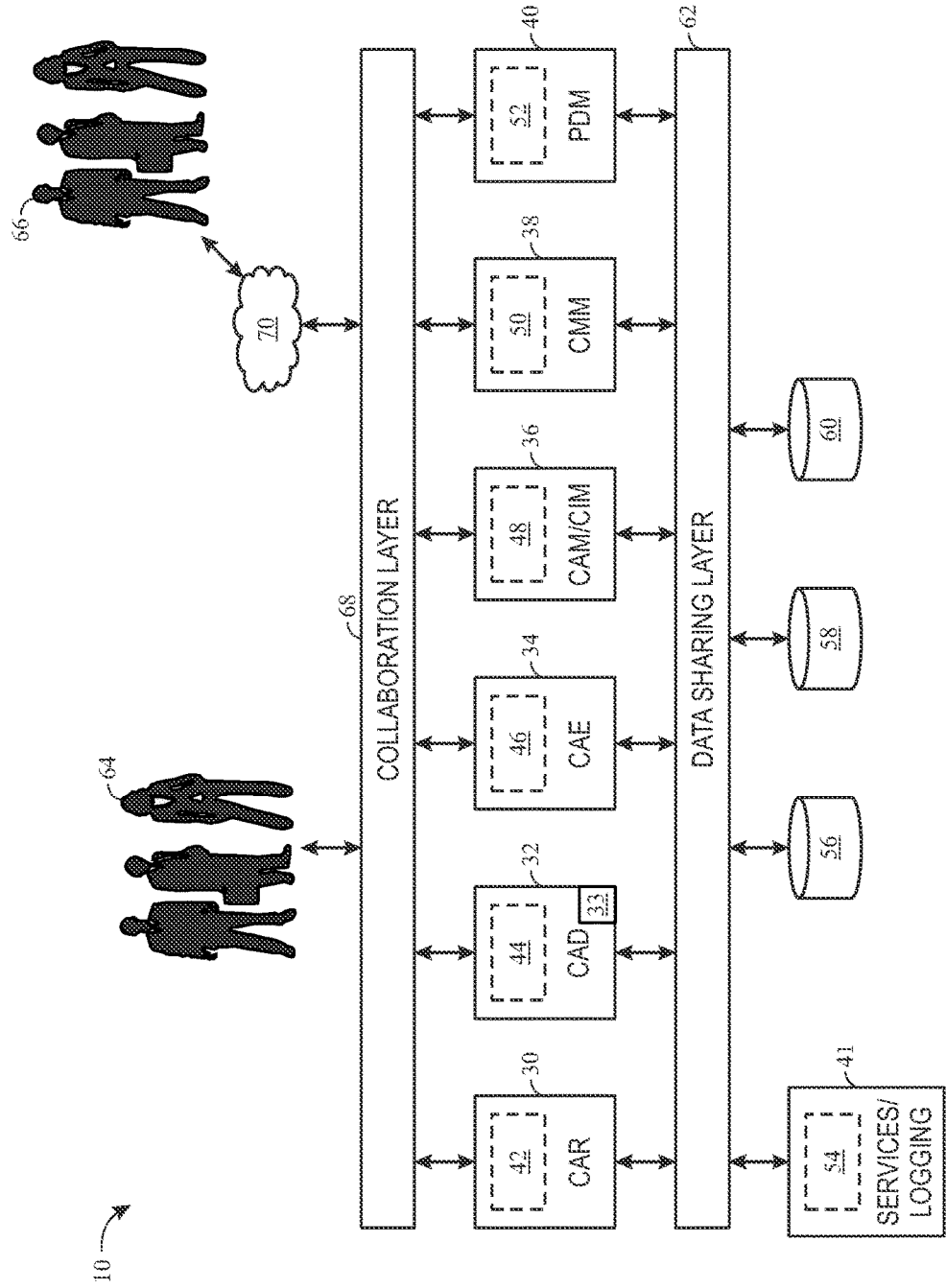
FIG. 2 is a block diagram of a certain components of the CAx system of FIG. 1, in accordance with the embodiments described herein.

The memory system 26 may store a variety of information, which may be suitable for various purposes. For example, the memory system 26 may store machine-readable and/or processor-executable instructions (e.g., firmware or software) for the processors' 24 execution. In one embodiment, the executable instructions include instructions for a number of PLM systems, for example software systems, as shown in the embodiment of FIG. 2. More specifically, the CAx system 10 embodiment illustrates a computer-aided requirements capture (CAR) system 30, a computer-aided design (CAD) system 32, a computer-aided engineering (CAE) system 34, computer-aided manufacturing/computer-integrated manufacturing (CAM/CIM) system 36, a coordinate-measuring machine (CMM) system 38, and a product data management (PDM) system 40, and a services/logging system 41. Each of the systems 30, 32, 34, 36, 38, 40, and 41 may be extensible and/or customizable, accordingly, each system 30, 32, 34, 36, 38, 40, and 41 may include an extensibility and customization system 42, 44, 46, 48, 50, 52, and 54, respectively. Additionally, each of the systems 30, 32, 34, 36, 38, 40, and 41 may be stored in a memory system, such as memory system 26, and may be executable via a processor, such as via processors 24.

In the depicted embodiment, the CAR system 30 may provide for entry of requirements and/or specifications, such as dimensions for the part or product, operational conditions that the part or product is expected to encounter (e.g., temperatures, pressures), certifications to be adhered to, quality control requirements, performance requirements, and so on. The CAD system 32 may provide for a graphical user interface suitable to create and manipulate graphical representations of 2D and/or 3D models, as described above with respect to the design processes 14. For example, the 3D design models may include solid/surface modeling, parametric models, wireframe models, vector models, non-uniform rational basis spline (NURBS) models, geometric models, and the like. The CAD system 32 may provide for the creation and update of the 2D and/or 3D models and related information (e.g., views, drawings, annotations, notes, callouts, etc.). Indeed, the CAD system 32 may combine a graphical representation of the part or product with other, related information. Further, the CAD system 32 may utilize a CAD compare tool 33. As discussed in further detail below, the CAD compare tool 33 may track and display revisions and changes to the model as it is updated. The CAD compare tool 33 may also provide for an interface in which a user may overlay revision versions of a model to observe differences in the model versions.

The CAE system 34 may enable creation of various engineering models, such as the models described above with respect to the development/engineering processes 16. For example, the CAE system 34 may apply engineering principles to create models such as thermodynamic models, low cycle fatigue (LCF) life prediction models, multibody dynamics (MBD) and kinematics models, computational fluid dynamics (CFD) models, finite element analysis (FEA) models, and/or 3-dimension to 2-dimension FEA mapping models. The CAE system 34 may then apply the aforementioned models to analyze certain part or product properties (e.g., physical properties, thermodynamic properties, fluid flow properties, and so on), for example, to better match the requirements and specifications for the part or product.

The CAM/CIM system 36 may provide for certain automation and manufacturing efficiencies, for example, by deriving certain programs or code (e.g., G-code) and then executing the programs or code to manufacture the part or product. The CAM/CIM system 36 may support certain automated manufacturing techniques, such as additive (or subtractive) manufacturing techniques, including material jetting, binder jetting, vat photopolymerization, powder bed fusion, sheet lamination, directed energy deposition, material extrusion, milling, lathing, plasma cutting, wire cutting, or a combination thereof. The CMM system 38 may include machinery to automate inspections. For example, probe-based, camera-based, and/or sensor-based machinery may automatically inspect the part or product to ensure compliance with certain design geometries, tolerances, shapes, and so on.

The PDM system 40 may be responsible for the management and publication of data from the systems 30, 32, 34, 36, 38, 40, and/or 41. For example, the systems 30, 32, 34, 36, 38, 40, and/or 41 may communicate with data repositories 56, 58, 60 via a data sharing layer 62. The PDM system 40 may then manage collaboration between the systems 30, 32, 34, 36, 38, 40, and/or 41 by providing for data translation services, versioning support, archive management, notices of updates, and so on. The PDM system 40 may additionally provide for business support such as interfacing with supplier/vendor systems and/or logistics systems for purchasing, invoicing, order tracking, and so on. The PDM system 40 may also interface with the service/logging system 41 (e.g., service center data management systems) to aid in tracking the maintenance and life cycle of the part or product as it undergoes operations. Teams 64, 66 may collaborate with team members via a collaboration layer 68. The collaboration layer 68 may include web interfaces, messaging systems, file drop/pickup systems, and the like, suitable for sharing information and a variety of data. The collaboration layer 68 may also include cloud-based systems 70 or communicate with the cloud-based systems 70 that may provide for decentralized computing services and file storage. For example, portions (or all) of the systems 30, 32, 34, 36, 38, 40, 41 may be stored in the cloud 70, be executable in the cloud 70, and/or accessible via the cloud 70.

The services/logging system 41 may include shop systems that are used to service a variety of machinery, and that may thus log replacement of parts, track a specific part use in a specific device, track number of hours of use, track maintenance performed, and so on. In one embodiment, the services/logging system 41 may be fleet-based. That is, the services/logging system 41 may store and analyze data for a fleet of machinery, such as a fleet of power-production machinery described in more detail with respect to FIG. 3.

A part may be manufactured and then inspected, for example via the CMM system 38. In one embodiment, the CAD system 32 may automatically generate CMM code (e.g., dimension suitable for inspecting the manufactured design. For example, the code (e.g., dimensional measuring interface standard [DMIS] code, CALYPSO code) may include a set of locations on the part or product that the CMM system may inspect via a probe, a laser, a camera, and so on. The code may additionally include travel paths, a complete measurement plan, allowable variations, for example, in geometry, and so on.

The extensibility and customization systems 42, 44, 46, 48, 50, and 52 may provide for functionality not found natively in the CAR system 30, the CAD system 32, the CAM/CIM system 36, the CMM system 38 and/or the PDM system 40. For example, computer code or instructions may be added to the systems 30, 32, 34, 36, 38, and/or 40 via shared libraries, modules, software subsystems and the like, included in the extensibility and customization systems 42, 44, 46, 48, 50, and/or 52. The extensibility and customization systems 42, 44, 46, 48, 50, and 52 may also use application programming interfaces (APIs) included in their respective systems 30, 32, 34, 36, 38, and 40 to execute certain functions, objects, shared data, software systems, and so on, useful in extending the capabilities of the CAR system 30, the CAD system 32, the CAM/CIM system 36, the CMM system 38 and/or the PDM system 40. By enabling the processes 12, 14, 16, 18, 20, and 22, for example, via the systems 30, 32, 34, 36, 38, and 40 and their respective extensibility and customization systems 42, 44, 46, 48, 50, and 52, the techniques described herein may provide for a more efficient "cradle-to-grave" product lifecycle management (PLM).

Figure 3:
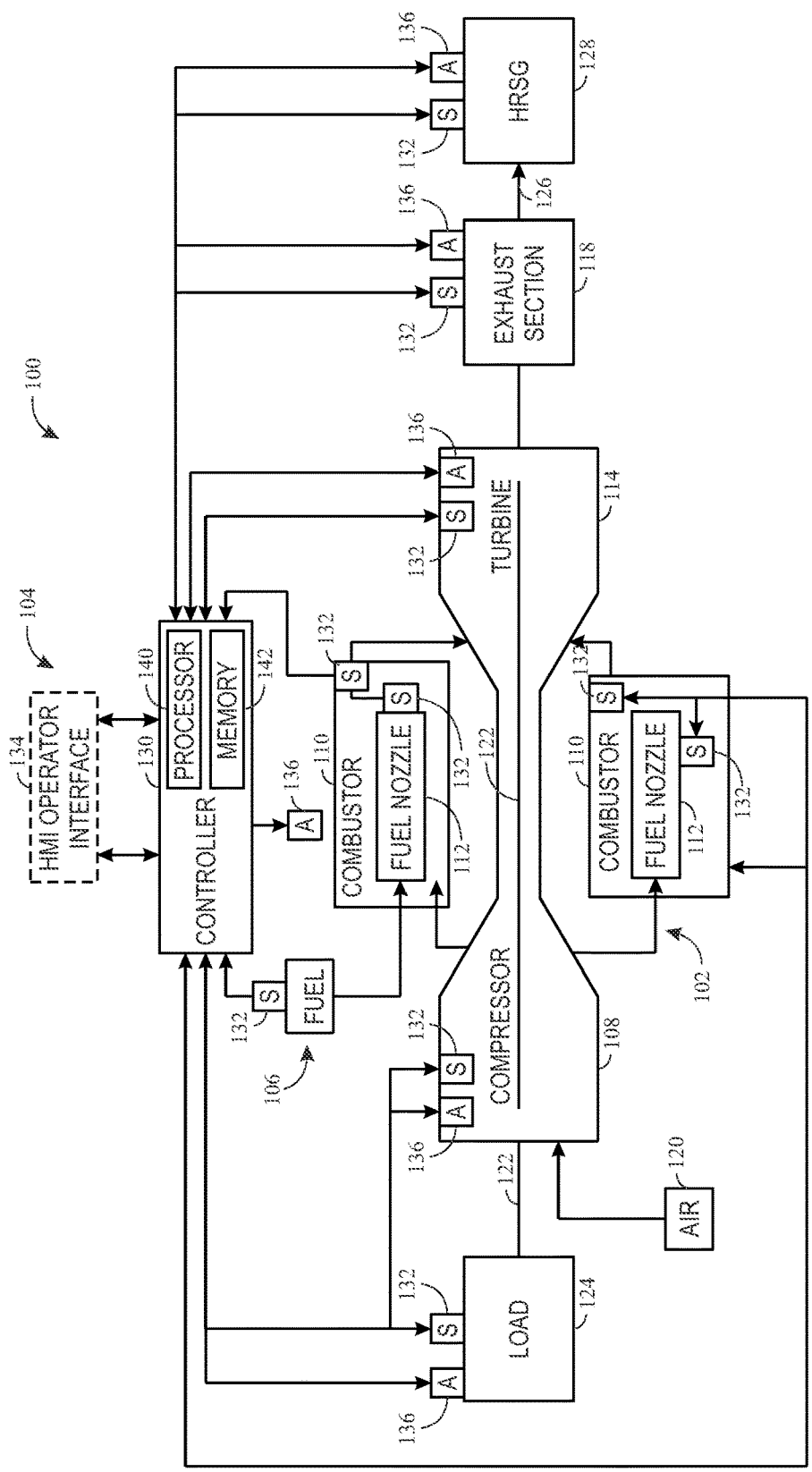
FIG. 3 is block diagram of an industrial system that may be conceived, designed, engineered, manufactured, and/or service and tracked by the CAx system of FIG. 1, in accordance with the embodiments described herein.

It may be beneficial to describe a machine that would incorporate one or more parts manufactured and tracked by the processes 12, 14, 16, 18, 20, and 22, for example, via the CAx system 10. Accordingly, FIG. 3 illustrates an example of a power production system 100 that may be entirely (or partially) conceived, designed, engineered, manufactured, serviced, and tracked by the CAx system 10. As illustrated in FIG. 1, the power production system 100 includes a gas turbine system 102, a monitoring and control system 104, and a fuel supply system 106. The gas turbine system 102 may include a compressor 108, combustion systems 110, fuel nozzles 112, a gas turbine 114, and an exhaust section 118. During operation, the gas turbine system 102 may pull air 120 into the compressor 108, which may then compress the air 120 and move the air 120 to the combustion system 110 (e.g., which may include a number of combustors). In the combustion system 110, the fuel nozzle 112 (or a number of fuel nozzles 112) may inject fuel that mixes with the compressed air 120 to create, for example, an air-fuel mixture.

The air-fuel mixture may combust in the combustion system 110 to generate hot combustion gases, which flow downstream into the turbine 114 to drive one or more turbine stages. For example, the combustion gases may move through the turbine 114 to drive one or more stages of turbine blades, which may in turn drive rotation of a shaft 122. The shaft 122 may connect to a load 124, such as a generator that uses the torque of the shaft 122 to produce electricity. After passing through the turbine 114, the hot combustion gases may vent as exhaust gases 126 into the environment by way of the exhaust section 118. The exhaust gas 126 may include gases such as carbon dioxide ($CO_2$), carbon monoxide (CO), nitrogen oxides ($NO_x$), and so forth.

The exhaust gas 126 may include thermal energy, and the thermal energy may be recovered by a heat recovery steam generation (HRSG) system 128. In combined cycle systems, such as the power plant 100, hot exhaust 126 may flow from the gas turbine 114 and pass to the HRSG 128, where it may be used to generate high-pressure, high-temperature steam. The steam produced by the HRSG 128 may then be passed through a steam turbine engine for further power generation. In addition, the produced steam may also be supplied to any other processes where steam may be used, such as to a gasifier used to combust the fuel to produce the untreated syngas. The gas turbine engine generation cycle is often referred to as the "topping cycle," whereas the steam turbine engine generation cycle is often referred to as the "bottoming cycle." Combining these two cycles may lead to greater efficiencies in both cycles. In particular, exhaust heat from the topping cycle may be captured and used to generate steam for use in the bottoming cycle.

In certain embodiments, the system 100 may also include a controller 130. The controller 130 may be communicatively coupled to a number of sensors 132, a human machine interface (HMI) operator interface 134, and one or more actuators 136 suitable for controlling components of the system 100. The actuators 136 may include valves, switches, positioners, pumps, and the like, suitable for controlling the various components of the system 100. The controller 130 may receive data from the sensors 132, and may be used to control the compressor 108, the combustors 110, the turbine 114, the exhaust section 118, the load 124, the HRSG 128, and so forth.

In certain embodiments, the HMI operator interface 134 may be executable by one or more computer systems of the system 100. A plant operator may interface with the system 100 via the HMI operator interface 134. Accordingly, the HMI operator interface 134 may include various input and output devices (e.g., mouse, keyboard, monitor, touch screen, or other suitable input and/or output device) such that the plant operator may provide commands (e.g., control and/or operational commands) to the controller 130.

The controller 130 may include a processor(s) 140 (e.g., a microprocessor(s)) that may execute software programs to perform the disclosed techniques. Moreover, the processor 140 may include multiple microprocessors, one or more "general-purpose" microprocessors, one or more special-purpose microprocessors, and/or one or more application specific integrated circuits (ASICS), or some combination thereof. For example, the processor 140 may include one or more reduced instruction set (RISC) processors. The controller 130 may include a memory device 142 that may store information such as control software, look up tables, configuration data, etc. The memory device 142 may include a tangible, non-transitory, machine-readable medium, such as a volatile memory (e.g., a random access memory (RAM)) and/or a nonvolatile memory (e.g., a read-only memory (ROM), flash memory, a hard drive, or any other suitable optical, magnetic, or solid-state storage medium, or a combination thereof).

With the foregoing in mind, parts of the gas turbine may be designed using the CAD system 32. As drawings of parts are generated and modified, the CAD compare tool 33 may be employed to identify changes between different drawings. In some embodiments the CAD compare tool 33 may be integral to the CAD system 32. For example, CAD models compared with the CAD compare tool 33 are not necessarily transported/translated from their native CAD environment (e.g., CAD system 32) before being compared. In some embodiments, a user may utilize a CAD program to design or revise a model of a part (e.g., a revised model) that is utilized in the power generation unit 11 of FIG. 3 (e.g., piping, turbine/compressor blade, etc.). The model may be a 2D and/or a 3D rendering of the part. Overall the CAD compare tool 33 may be used to flag discrepancies between models so that changes between revisions/versions may be identified, verified, and reported. In some embodiments, the changes may be reported to downstream manufacturers that may utilize the report to manufacture the part. For example, FIG. 4 is a flow chart of one embodiment of a method 400 that may be employed by the CAD compare tool 33 to compare drawings.

Figure 4:
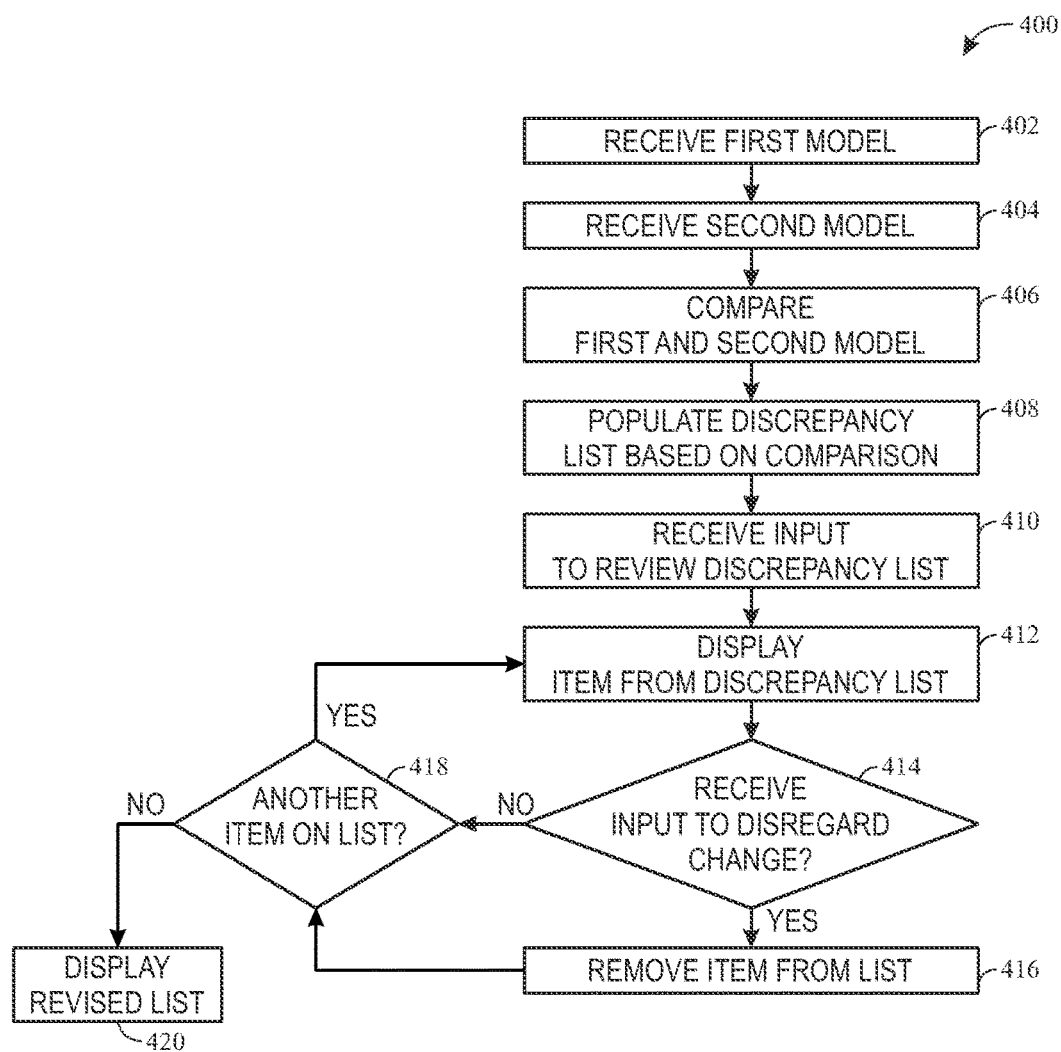
FIG. 4 is a flow chart of an embodiment of a method for comparing two or more drawings that may be employed by a CAD compare tool in the CAx system of FIG. 1, in accordance with the embodiments described herein.

Referring now to FIG. 4, at block 402, the CAD compare tool 33 may receive data related to a first model. In some embodiments, the first model may have been revised or generated based on a second model. In any case, a user may utilize CAD software to design the first and second models, which may illustrate a machine or a part of a machine. In some embodiments, the CAD compare tool may receive the first model directly from a database (e.g., a hard drive, repositories 56, 58, 60, data sharing layer 62, and/or collaboration layer 68).

Figure 5:
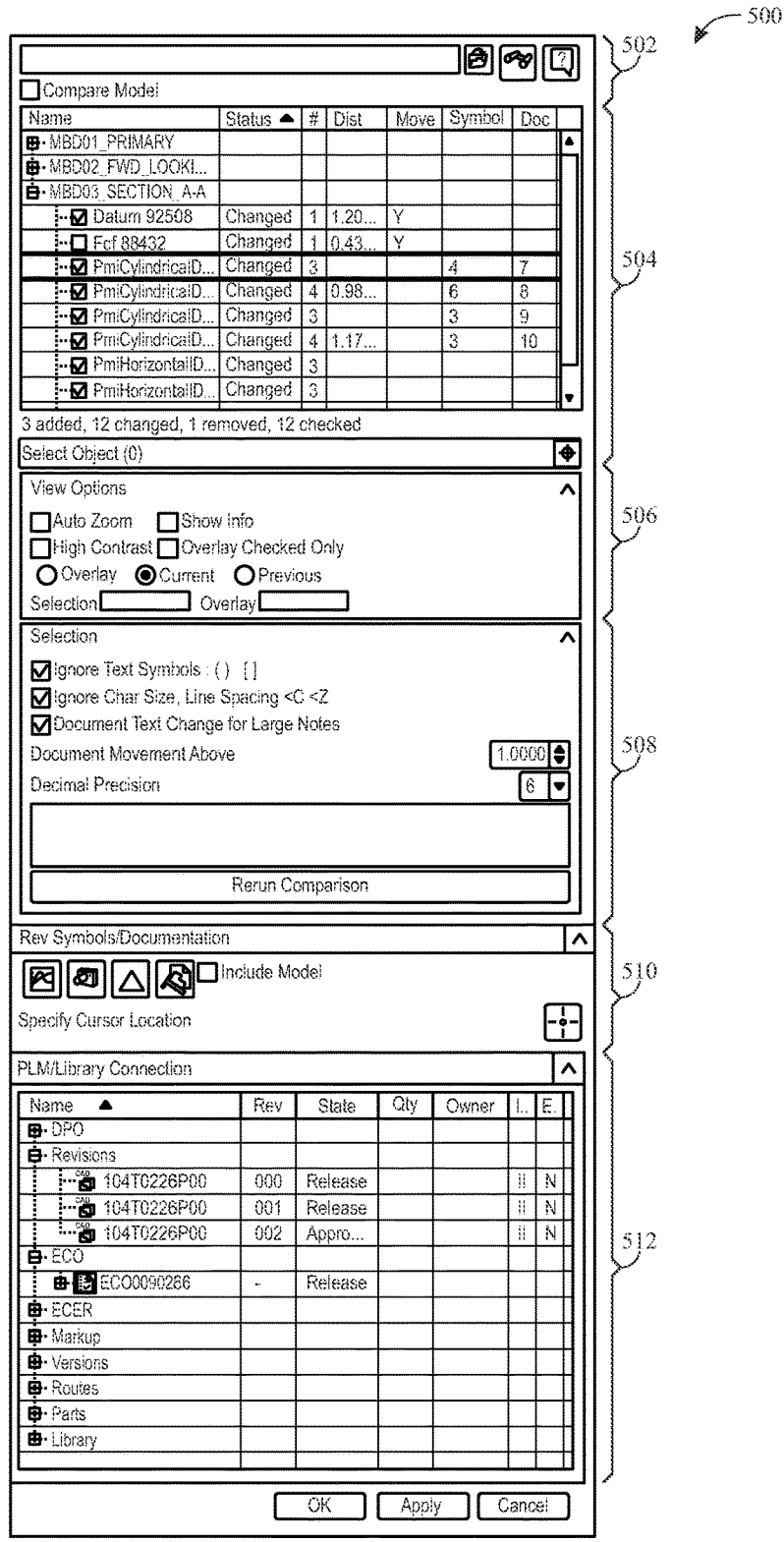
FIG. 5 is an embodiment of a portion of a user interface that may be utilized by the CAD compare tool of FIG. 1, in accordance with the embodiments described herein.

After the CAD compare tool 33 has received the data regarding the first model, in some embodiments, the CAD compare tool 33 may analyze the first model and provide a list of models (e.g., as seen in FIG. 5) that may be related to the first model. For example, the CAD compare tool 33 may review a name and definition of the first model and suggest previous model revisions or similar model versions related to the first model.

At block 404, the CAD compare tool 33 may receive a second model. As mentioned above, the second model may be an original version of the first model or another revision or version of the first model that the CAD compare tool received at block 402. In some embodiments, the second model may be provided from a database (e.g., a hard drive, repositories 56, 58, 60, data sharing layer 62, and/or collaboration layer 68). In one embodiment, the CAD compare tool 33 may display, via a user interface, the first model and the second model in a side-by-side view. A user may select which view orientation (e.g., lateral, vertical, isometric, trimetric, section view, and the like) that the first model and the second model may be displayed. The CAD compare tool 33 may also display one of either the first model or the second model at a single time. In some embodiments, the CAD compare tool 33 may overlay views, and/or selected portions of views, of the first model and the second model for view.

At block 406, the CAD comparison tool 33 may compare the first model and the second model. The CAD compare tool 33 may leverage model data/information to determine position values of model elements to create a complete comparison between revisions and versions of models. In one embodiment, the CAD comparison tool 33 may iterate through the first and second models, noting differences in geometries, annotations, definitions, and the like. The CAD comparison tool 33 may compare each view of the models, compare each geometry, annotation, definition, and the like, and/or compare each view and facet of the models simultaneously. The CAD comparison tool 33 may then store identified differences of the models in a memory (e.g., memory system 26). Geometries of a model may include the shape, size, orientation, etc. Definitions of a model are a set of predefined attributes that may include color, line style, line thickness, shading, lighting, material composition, weight, color, identification name/number, etc. Annotations of a model may include notes, labels, tabular data, dimensions, tolerances, hatches, gradients, fills, symbols, title blocks, product manufacturing annotations (PMIs), etc.

At block 408, the CAD comparison tool 33 may populate a discrepancy list based on the differences noted in block 406. As seen in FIG. 5, the discrepancy list may, in one embodiment, be in a tree list format. The tree list may have one or more top nodes indicating a general item and one or more sub nodes that are associated with, and branch off of, a respective top node. More specifically, the tree list may have top nodes of the model (e.g., the first model and/or the second model) or drawing views and sub nodes of the geometry, definition, and/or annotation object discrepancies. The CAD compare tool 33 may also flag discrepancies directly on a displayed model view. For example, the discrepancies may be flagged with icons (e.g., revision triangles, clouds) and/or annotations that is adjacent to the discrepancy. The flagged discrepancies may indicate what has changed and/or by how much (e.g., a difference in size, length, location, etc.).

At block 410, the CAD comparison tool 33 may receive an input to review the discrepancy list. That is, after populating the discrepancy list, the CAD comparison tool 33 may prompt a user to provide input on whether or not the user wishes to review the discrepancies noted at block 408. The user may then indicate, via the input, to review the discrepancy list. The user may indicate to review the discrepancy list for a number of reasons. As mentioned above, after a revision is made to an element (e.g., geometry, definition, annotation, etc.), other elements may experience an unintended change. For example, if an element (e.g., hole) is intended to be positioned in the center of an object (e.g., pipe) and a length of the object was increased, the element may move with the increase of the length instead of staying in its intended position. As such, a user may want to take notice of all changes made to a model, regardless of whether or not the change was intentional. A user may also indicate to review the discrepancy list to disregard (e.g., filter) superfluous changes. For example, when changing an element of a model (e.g., geometry, definition, annotation), a product manufacturing information (PMI) annotation may move. The CAD comparison tool 33 may flag the PMI annotation movement as a discrepancy between the original first and the second model. However, a user may not wish to report the movement of a PMI annotation to downstream (or upstream) manufacturers. Therefore, the user may choose to remove (e.g., disregard) this discrepancy from the discrepancy list. In some embodiments, a user may select an option to change a discrepancy so that it is no longer a discrepancy. For example, if the CAD compare tool flags an element discrepancy on the first model (e.g., an element that is different from the second model), the user may select an option to change the element on the first model to match an associated element on the second model.

If the user provides an indication to review the discrepancy list, the CAD compare tool 33 may display, one or more at a time, items from the discrepancy list (block 412). A user may select a discrepancy and choose whether or not the discrepancy should be disregarded (block 414). If the user does not indicate that the discrepancy should be disregarded, the CAD compare tool 33 may keep the respective discrepancy in the list. In some embodiments, the CAD compare tool 33 may receive a verification from the user to keep a discrepancy. If the user does not disregard the discrepancy (or verifies the discrepancy), the CAD compare tool 33 may then determine if there are further items on the discrepancy list that have not been reviewed by the user (block 418). If there are further items that have not been reviewed by the user, the CAD compare tool 33 may display the next item (or continue to display several items) on the discrepancy list (block 412). The CAD compare tool 33 may then once again receive input form a user as to whether or not the discrepancy should be disregarded (block 414).

As discussed above, in some embodiments, the CAD compare tool 33 may flag discrepancies that may be undesirable to be reported. As such, a user may indicate that the discrepancy should be removed from the discrepancy list. The discrepancy may then accordingly be removed from the discrepancy list (block 416). Once again, the CAD compare tool 33 may determine if there are further items on the discrepancy list that have not been reviewed by the user (block 418). If all of the discrepancies on the discrepancy list have been reviewed, the CAD compare tool 33 may display (e.g., output) a current list of discrepancies (block 420). In some embodiments, the CAD compare tool 33 may display, via documentation, the current list of discrepancies. In some embodiments, the current list of discrepancies that are displayed via the documentation may only include discrepancies that have been verified (e.g., checked) through user input. For example, the CAD compare tool 33 may output is/was documentation detailing the current list of discrepancies (e.g., changes). In some embodiments, "is/was" documentation may describe in a text-based format what an element currently is (e.g., an element in the second model) and what an element was (e.g., the element in the original model). In some embodiments, the CAD compare tool 33 may receive an input to produce documentation of the discrepancies after the user has reviewed none, or only a portion, of the discrepancies. In some embodiments, documentation of discrepancies may in a text and/or a pictorial form.

Further, it should be noted that although the CAD compare tool 33 function as described above with respect to FIG. 4, the CAD compare tool 33 may perform some functions in a different manner. While the CAD compare tool 33 may populate a discrepancy list to display discrepancies between two models, in some embodiments, the CAD compare tool 33 may display discrepancies by placing icons directly on a model viewing window as seen if FIG. 6. A user may then select the icon, via a graphical user interface (GUI), and either verify or disregard (e.g., delete) the discrepancy. If the user disregards the discrepancy, the icon and the discrepancy associated with the icon may be removed from the viewing window and the discrepancy list. If a discrepancy is verified, it may be documented in the discrepancy list. In some embodiments, if there are multiple icons in a small area for example, the user may zoom into the area to better view the individual icons. The user may then proceed to disregard or verify the discrepancy as described above. Indeed, although the user may verify a discrepancy, in some embodiments, simply not disregarding the discrepancy may have the same effect as verifying a discrepancy. Essentially, a user may select which discrepancies to report in the discrepancy list.

Yet further, it should be noted that, although the CAD compare tool 33 has been described herein as functioning while utilizing input from a user, the CAD compare tool 33 may sometimes function in a pre-programmed manner. For example, in some embodiments the CAD compare tool 33 may proactively disregard certain discrepancies (e.g., PMI annotation movement).

In some embodiments, the CAD compare tool 33 may not compare all facets of two models. For example, the CAD compare tool 33 may compare certain facets (e.g., certain views, geometries, features, etc.) of two models. A user may utilize a user interface of the CAD compare tool 33 to indicate (e.g., highlight, select) the certain facets to be compared. Additionally, or in the alternative, the CAD compare tool 33 may compare other aspects of models. The other aspects of models may include a bill of materials (BOM), engineering change requests (ECR), engineering change orders (ECO), etc. ECRs are numbered documents that are used to track requested product changes. ECOs are numbered documents that are used to track product changes.

FIG. 5 is an embodiment of a portion of a user interface 500 that may be displayed by the CAD compare tool 33. The user interface 500 may include several sections. For example, the user interface 500 may include a comparison section 502, a discrepancy list section 504, a viewing options section 506, a rules section 508, a symbol/documentation section 510, and/or an associated files section 512. The comparison section 502 may include a first button that, when clicked, opens help documentation and/or videos that may assist the user in utilizing the CAD compare tool 33. The comparison section 502 may also include a second button that, when clicked, searches a database (e.g. a product lifecycle management (PLM) database, a hard drive, repositories 56, 58, 60, data sharing layer 62, and/or collaboration layer 68) for previous revision versions. The comparison section 502 may also include a button that, when clicked, a user may open a browsing tool to search the database for a file to import into the CAD compare tool 33.

The discrepancy list section 504 may be as described above with respect to FIG. 4. For example, the discrepancy list section 504 may display discrepancies in a tree list format with models and/or views as top nodes and sub nodes as discrepancies. Further, the discrepancy list section 504 may display a type of discrepancy, a number of discrepancies, if a discrepancy is a location change, a revision symbol position, and/or a document identifier (e.g., a document number). In some embodiments, a user may verify a discrepancy, create a revision symbol for the discrepancy, and/or create discrepancy documentation for the discrepancy via a check box provided in the discrepancy list section 504. In some embodiments, a user may select one or more items on the discrepancy list section 504 to highlight an object associated with the one or more items in a drawing window, to zoom into the associated object in the drawing window, to show discrepancy information of the associated object, and/or to undo changes made to the user interface 500 and/or drawings. A user also may create a portable document format (PDF) version detailing discrepancies and/or images of selected items. In some embodiments, the CAD compare tool 33 may compare screen images (e.g., a screenshot comparison). In some embodiments, if the CAD compare tool 33 detects a change (e.g., discrepancy) between models, the user may choose to undo the change.

From the viewing options section 506, a user may customize facets of the CAD compare tool 33. For example, a user may choose to automatically zoom into discrepancies that are selected, display information (e.g., definitions, names, etc.), and/or overlay portions of models that are being compared. The user may also select a high-contrast view (e.g., set a background to white, set a foreground to black, set an object to red, etc.). The user may also select a color in which an object is displayed, and a color in which an overlaid object is displayed. The user may also indicate, when models are in an overlaid position, whether to show all elements of the models or to show only selected elements of the models. The user may also switch views between an overlay view, a view of the current model, a view of an older revision/version of the model, or any combination thereof. Models in an overlaid position may more easily show geometric differences between the models.

From the rules section 508, a user may customize a set of rules for comparing models. For example, a user may select an option to instruct the CAD compare tool 33 to ignore discrepancies regarding symbol, text, spacing, etc. In some embodiments, the user may specify a minimum displacement (e.g., threshold) an element has to move to constitute a discrepancy, a number of digits to the right of a decimal, a number of significant digits, or any combination thereof to be checked when comparing elements. More specifically, the minimum displacement, number of digits to the right of a decimal, and the number of significant digits may refer to numerical values of element attributes (e.g., surface area, length, weight, location, etc.) The user may also select one or more elements of the models to ignore (or select one or more elements of the models to only check) when comparing the models. After the user has customized the rules section 508, made changes to the model, and/or made changes to another portion of the user interface 500, the user may utilize the rules section 508 to run another comparison of the models with the newly customized rules.

From the symbol/documentation section 510, a user may create symbols and/or documentation that may characterize discrepancies between models. The symbol/documentation section 510 may provide options to include selected model features in revision documentation, add a revision symbol to a selected element at a specified location, create revision documentation (e.g., revision documentation for verified (e.g., checked) discrepancies and/or discrepancies that have not been disregarded), create revision symbols for one or more selected items, create a snapshot (e.g., screenshot) of a current view to compare utilizing the CAD compare tool 33, create a PDF of selected (e.g., checked) views/elements, or any combination thereof.

The associated files section 512 may display a list (e.g., tree list) of files associated with the current model (e.g., first model). More specifically, the associated files section 512 may connect to a database, (e.g., PLM database) retrieve items (e.g., models) related to the current model, and display the items. A user may select an item (e.g., associated model) to compare to the current model. In some embodiments, the associated files section 512 may prompt the user for login information before displaying items (e.g., associated files and/or models). A user may also choose to apply changes made utilizing the user interface 500, cancel changes made to the user interface 500, and/or accept changes made utilizing the user interface 500.

Figure 6:
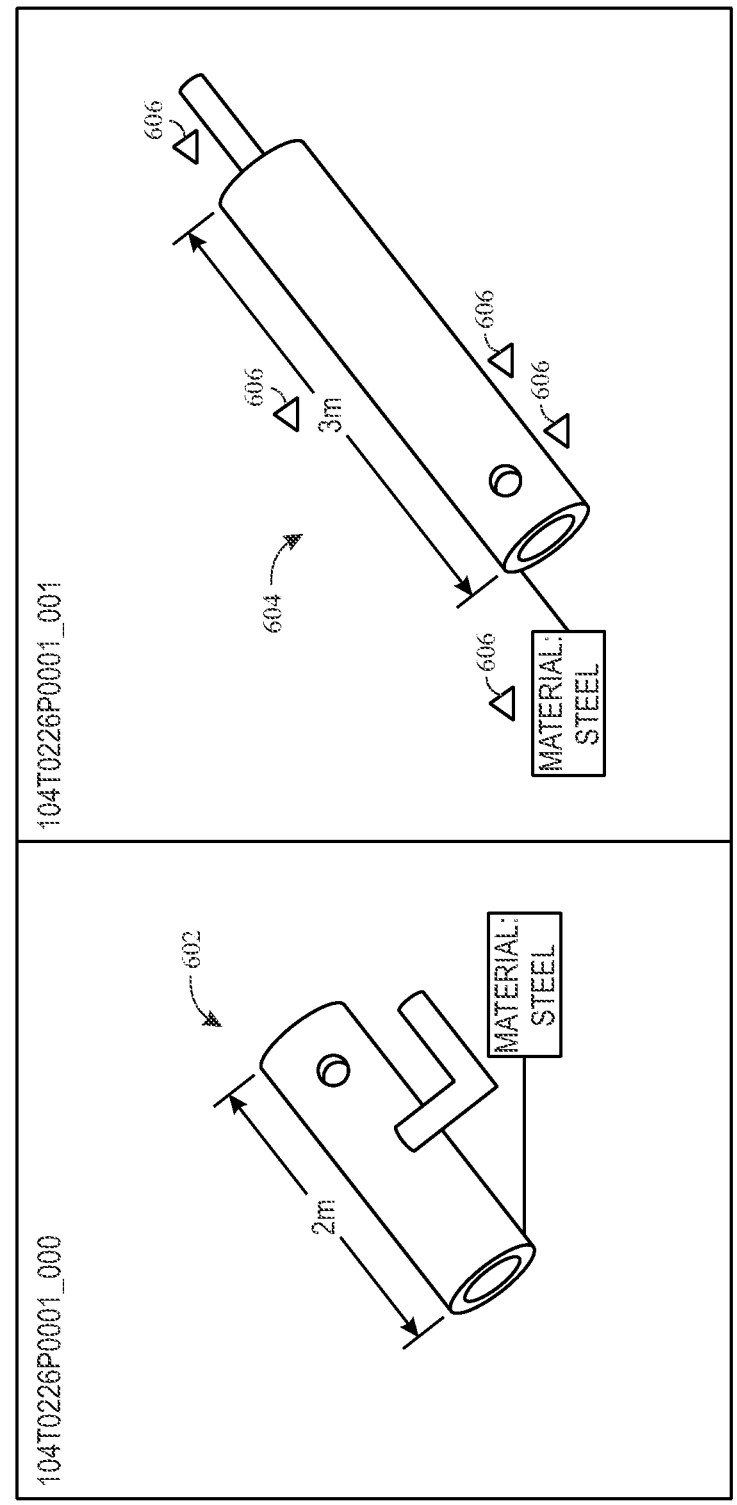
FIG. 6 included illustrations of part models that may have been compared utilizing the CAD compare tool of FIG. 1, in accordance with the embodiments described herein.

FIG. 6 includes illustrations of part models that may have been compared utilizing the CAD compare tool 33 of FIG. 1. The part models may be displayed via a comparing window 600. The comparing window 600 may display a first model 602, a second model 604, or both at the same time. In some embodiments, the comparing window 600 may overlay the first model 602 and the second model 604. As discussed above, the CAD compare tool 33 may compare the first model 602 and the second model 604 and flag discrepancies between the models 602, 604. Discrepancies may include revision, deletion, and/or addition of geometries, annotations, and/or definitions. For example, the second model 604 is shown as flagged with multiple icons 606 that indicate discrepancies. As described above, a user may select the icons 606 to view more information on the discrepancy, verify the discrepancy, and/or disregard the discrepancy. Selecting a discrepancy in the discrepancy list and/or on the icon may also highlight the geometry, annotation, etc. that the discrepancy is referring to.

Technical effects of the invention include providing a comparison tool that may compare different model versions and/or different model versions or revisions. After a revision is made to a model, a ripple effect may occur causing unintended changes to a model. As such, the embodiments disclosed herein may provide for an efficient manner to review revisions (intentional or unintentional) and create documentation based on the reviewed revisions. Overall, the disclosed embodiments saves time and provides for an efficient system and method for a user to review changes made to a model.

It should be noted that, as discussed above, the CAD compare tool 33 may compare CAD models (e.g., first and second models) within the CAD system 32. For example, the CAD models may be compared using the CAD compare tool 33 within their native CAD environment (e.g., CAD system 32). This may be advantageous as the CAD models may not be translated and/or exported before utilizing the CAD compare tool 33. The CAD models may be two different model versions of the same part (e.g., machine part), or in some embodiments, the CAD models may be model versions of different parts (e.g., machine parts). Further, the CAD compare tool 33 may receive the CAD models from a database (e.g., an internal database, PLM database (e.g., PLM system), a hard drive, repositories 56, 58, 60, data sharing layer 62, and/or collaboration layer 68.). Accordingly, as described above, the CAD compare tool 33 may search the database for further models related to one or more of the CAD models and provide the further models as options to utilize in a comparison process (e.g., method 400). Overall, the CAD compare tool 33 may compare dimensions, annotations, geometry, etc. of the CAD models and note the discrepancies between the CAD models as described above. The CAD compare tool 33 may provide documentation of the discrepancies in a textual and/or pictorial form. Further, a user may select which discrepancies are reported in the documentation as described above.

This written description uses examples to disclose the embodiments described herein, including the best mode, and also to enable any person skilled in the art to practice the embodiments described herein, including making and using any devices or systems and performing any incorporated methods. The patentable scope of the embodiments described herein is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

The invention claimed is:

1. A system comprising:
a display;
a processor configured to:
receive a first computer-aided design (CAD) model representing at least one part of a machine;
receive a second CAD model representing the at least one part of the machine;
compare a first dataset indicative of a first set of position values of a first set of elements of the first CAD model to a second dataset indicative of a second set of position values of a second set of elements of the second CAD model to identify a plurality of differences between the first CAD model and the second CAD model, wherein the first set of elements directly correspond to the second set of elements;
populate a discrepancy list comprising the plurality of differences between the first CAD model and the second CAD model;
receive an input to review the discrepancy list;
display a visualization comprising the discrepancy list via the display in response to receiving the input;
receive a second input configured to disregard a first difference of the plurality of differences in discrepancy list;
receive a third input to verify a second difference of the plurality of differences, wherein the second difference has not been disregarded; and
update the visualization to include an updated discrepancy list comprising a portion of the plurality of differences, wherein each difference of the portion of the plurality of differences has been verified.

2. The system of claim 1, wherein the processor is configured to identify the plurality of differences between the first CAD model and the second CAD model by comparing data comprising one or more geometries, one or more definitions, one or more annotations, or any combination thereof associated with the at least one part of the machine represented in the first CAD model and the second CAD model.

3. The system of claim 1, wherein the visualization comprises a first model image representative of the first CAD model and a second model image representative of the second CAD model depicted side-by-side, and wherein the first model image or the second model image comprises one or more icons indicative of one or more items in the discrepancy list.

4. The system of claim 3, wherein the one or more icons are depicted adjacent to one or more elements of the at least one part that correspond to one or more differences of the plurality of differences.

5. The system of claim 1, wherein the processor is configured to receive the second CAD model by:
identifying one or more CAD models associated with the first CAD model after receiving the first CAD model; and
receiving a fourth input configured to select one of the one or more CAD models as the second CAD model.

6. The system of claim 5, wherein the one or more CAD models comprise one or more versions of the first CAD model.

7. The system of claim 1, wherein the processor is configured to generate documentation based on the discrepancy list.

8. A method, comprising:
receiving, via a processor, a first computer-aided design (CAD) model representing at least one part of a machine;
receiving, via the processor, a second CAD model representing the at least one part of the machine;
identifying, via the processor, a plurality of differences between the first CAD model and the second CAD model;
populating, via the processor, a discrepancy list comprising the plurality of differences between the first CAD model and the second CAD model;
receiving, via the processor, an input to review the discrepancy list;
generating, via the processor, one or more interactive icons associated with one or more differences of the plurality of differences;
receiving, via the processor, one or more first inputs associated with the one or more interactive icons, wherein the one or more first inputs are configured to verify that the one or more differences is to remain on the discrepancy list;
generating, via the processor, an updated discrepancy list comprising the one or more differences and excluding a portion of the plurality of differences that did not receive the one or more first inputs; and
displaying, via the processor, a visualization comprising the updated discrepancy list via a display upon receipt of the input.

9. The method of claim 8, wherein identifying the one or more differences comprises:
receiving, via the processor, an indication of a first portion of the first CAD model; and
identifying, via the processor, a second portion of the plurality of differences between the first portion of the first CAD model and a third portion of the second CAD model, wherein the first portion corresponds to the third portion.

10. The method of claim 9, wherein the first portion and the second portion comprise a bill of materials (BOM), an engineering change request (ECR), an engineering change order (ECO), or any combination thereof.

11. The method of claim 9, wherein the first portion and the second portion comprise a screenshot of the at least one part of the machine.

12. The method of claim 8, comprising:
receiving, via the processor, a second input configured to change one or more properties of the second CAD model such that a second portion of the second CAD model that corresponds to a third portion of the plurality of differences is modified to match the first CAD model.

13. The method of claim 8, wherein populating the discrepancy list comprises:
receiving, via the processor, a set of rules for determining a second portion of the plurality of differences between the first CAD model and the second CAD model, wherein the set of rules comprise a minimum displacement, a first number of digits after a decimal to check, a second number of significant digits to check, or any combination thereof.

14. A non-transitory computer-readable medium comprising computer-executable instructions configured to cause a processor to:
receive a first computer-aided design (CAD) model representing at least one part of a machine;
receive a second CAD model representing the at least one part of the machine;
identify a plurality of differences between the first CAD model and the second CAD model;
populate a discrepancy list comprising the plurality of differences between the first CAD model and the second CAD model;
filter a portion of the plurality of differences according to a pre-programmed filter configured to remove a type of difference from the plurality of differences;
generate an updated discrepancy list based on the plurality of differences and the portion of the plurality of differences;
receive an input to review the discrepancy list; and
display a visualization comprising the updated discrepancy list via a display in response to receiving the input.

15. The non-transitory computer-readable medium of claim 14, wherein the computer-executable instructions are configured to cause the processor to:
receive a second input configured to verify that at least one of the plurality of differences of the discrepancy list is to remain on the discrepancy list; and
generate documentation comprising the discrepancy list having only the at least one of the plurality of differences.

16. The non-transitory computer-readable medium of claim 14, wherein the computer-executable instructions are configured to cause the processor to:
receive a second input configured to change one or more properties of the second CAD model such that a portion of the second CAD model that corresponds to a second portion of the plurality of differences is modified to match the first CAD model; and
receive a set of rules for determining a third portion of the plurality of differences between the first CAD model and the second CAD model, wherein the set of rules comprise a minimum displacement, a first number of digits after a decimal to check, a second number of significant digits to check, or any combination thereof.

17. The non-transitory computer-readable medium of claim 14, wherein the computer-executable instructions are configured to cause the processor to receive the second CAD model by:
identifying one or more CAD models associated with the first CAD model after receiving the first CAD model; and receiving a second input configured to select one of the one or more CAD models as the second CAD model.

18. The non-transitory computer-readable medium of claim 14, wherein the computer-executable instructions are configured to cause the processor to:
   identify the plurality of differences between the first CAD model and the second CAD model by comparing data comprising one or more geometries, one or more definitions, one or more annotations, or any combination thereof associated with the at least one part of the machine represented in the first CAD model and the second CAD model.

19. The non-transitory computer-readable medium of claim 14, wherein the visualization comprises a first model image representative of the first CAD model and a second model image representative of the second CAD model depicted overlaid on the first model image.

* * * * *